(12) United States Patent
Puscasu

(10) Patent No.: US 10,802,079 B2
(45) Date of Patent: Oct. 13, 2020

(54) SYSTEM AND METHOD FOR BIDIRECTIONAL CURRENT SENSE CIRCUITS

(71) Applicant: SEMICONDUCTOR COMPONENTS INDUSTRIES, LLC, Phoenix, AZ (US)

(72) Inventor: Razvan Puscasu, Targoviste (RO)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 75 days.

(21) Appl. No.: 16/247,811

(22) Filed: Jan. 15, 2019

(65) Prior Publication Data

US 2020/0025830 A1    Jan. 23, 2020

Related U.S. Application Data

(60) Provisional application No. 62/699,043, filed on Jul. 17, 2018.

(51) Int. Cl.
| | |
|---|---|
| *G01R 31/387* | (2019.01) |
| *H03F 3/72* | (2006.01) |
| *H02M 3/07* | (2006.01) |
| *G01R 31/382* | (2019.01) |

(52) U.S. Cl.
CPC ......... *G01R 31/387* (2019.01); *G01R 31/382* (2019.01); *H02M 3/07* (2013.01); *H03F 3/72* (2013.01); *H03F 2203/7203* (2013.01); *H03F 2203/7212* (2013.01)

(58) Field of Classification Search
CPC ............................ G01R 31/387; G01R 31/382
USPC ........................................................ 324/691
See application file for complete search history.

(56) References Cited

U.S. PATENT DOCUMENTS

| | | | |
|---|---|---|---|
| 5,589,697 A | 12/1996 | Smayling et al. | |
| 9,291,680 B2 * | 3/2016 | Tang | G01R 31/382 |
| 9,496,835 B2 * | 11/2016 | Creosteanu | H03F 1/0205 |
| 10,320,346 B2 * | 6/2019 | Puscasu | H03F 3/393 |
| 10,326,358 B2 * | 6/2019 | Giuliano | H02M 3/158 |

(Continued)

OTHER PUBLICATIONS

"NCS210, NCS211, NCS212, NCS213, NCS214, NCS215; Current-Shunt Monitor, Voltage Output, Bi-Directional Zero-Drift," ON Semiconductor Product Sheet, Oct. 2015, 5 pages, Copyright Semiconductor Components Industries, LLC 2015.

*Primary Examiner* — Reena Aurora
(74) *Attorney, Agent, or Firm* — Dickinson Wright PLLC; Mark E. Scott

(57) ABSTRACT

Operating current sense circuits. At least some of the example embodiments are methods including: sensing a current flow through a sense resistor by way of an operational amplifier defining a non-inverting input coupled to a first side of the sense resistor and an inverting input coupled to a second side of the sense resistor; driving a signal to a sense output of the operational amplifier, the signal proportional to the current flow through the sense resistor; and then disabling the current sense circuit comprising: de-coupling a first feedback path of the operational amplifier, the first feedback path coupled to the non-inverting input; and de-coupling a second feedback path of the operational amplifier, the second feedback path coupled to the inverting input. The methods also include disabling the current sense circuit by disabling an input stage of the operational amplifier.

20 Claims, 7 Drawing Sheets

(56) References Cited

U.S. PATENT DOCUMENTS

2005/0179488 A1     8/2005   Dvorak
2014/0118074 A1     5/2014   Levesque et al.

\* cited by examiner

SYSTEM AND METHOD FOR BIDIRECTIONAL CURRENT SENSE CIRCUITS

CROSS-REFERENCE TO RELATED APPLICATIONS

This application claims the benefit of U.S. Provisional Application No. 62/699,043 filed Jul. 17, 2018 titled "System and Method For Bidirectional Current Sense Circuits." The provisional application is incorporated by reference herein as if reproduced in full below.

BACKGROUND

Battery-operated devices, such as smart phones and laptop computers, monitor battery usage to ensure the user is notified when remaining energy in the battery is low and charging is needed. However, the circuits used to monitor battery usage (e.g., current sense circuits monitoring current flow through a sense resistor) themselves use energy from the battery. When battery-operated devices are not in use or in low power mode, many systems within the battery-operated devices are turned off or placed in a reduced power mode.

BRIEF DESCRIPTION OF THE DRAWINGS

For a detailed description of example embodiments, reference will now be made to the accompanying drawings in which.

DEFINITIONS

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

In relation to electrical devices, the terms "input" and "output" refer to electrical connections to the electrical devices, and shall not be read as verbs requiring action. For example, an amplifier may have two sense inputs and one sense output.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

At least some of the example embodiments are directed to systems and methods of bidirectional current sense circuits. More particularly, example embodiments are directed to current sense circuits that may be placed in a low power mode, reducing the amount of current drawn through the current sense circuit during periods of time when the current sense circuit is disabled. More particularly still, example embodiments are directed to electrically disconnecting or de-coupling feedback paths of the operational amplifier to reduce current flow during periods of time when the current sense circuit is disabled. In yet still further embodiments, an input stage of the operational amplifier is disabled in such a way as to reduce current flow during periods of time when the current sense circuit is disabled. The specification now turns to an example current sense system in accordance with example embodiments.

Figure 1:
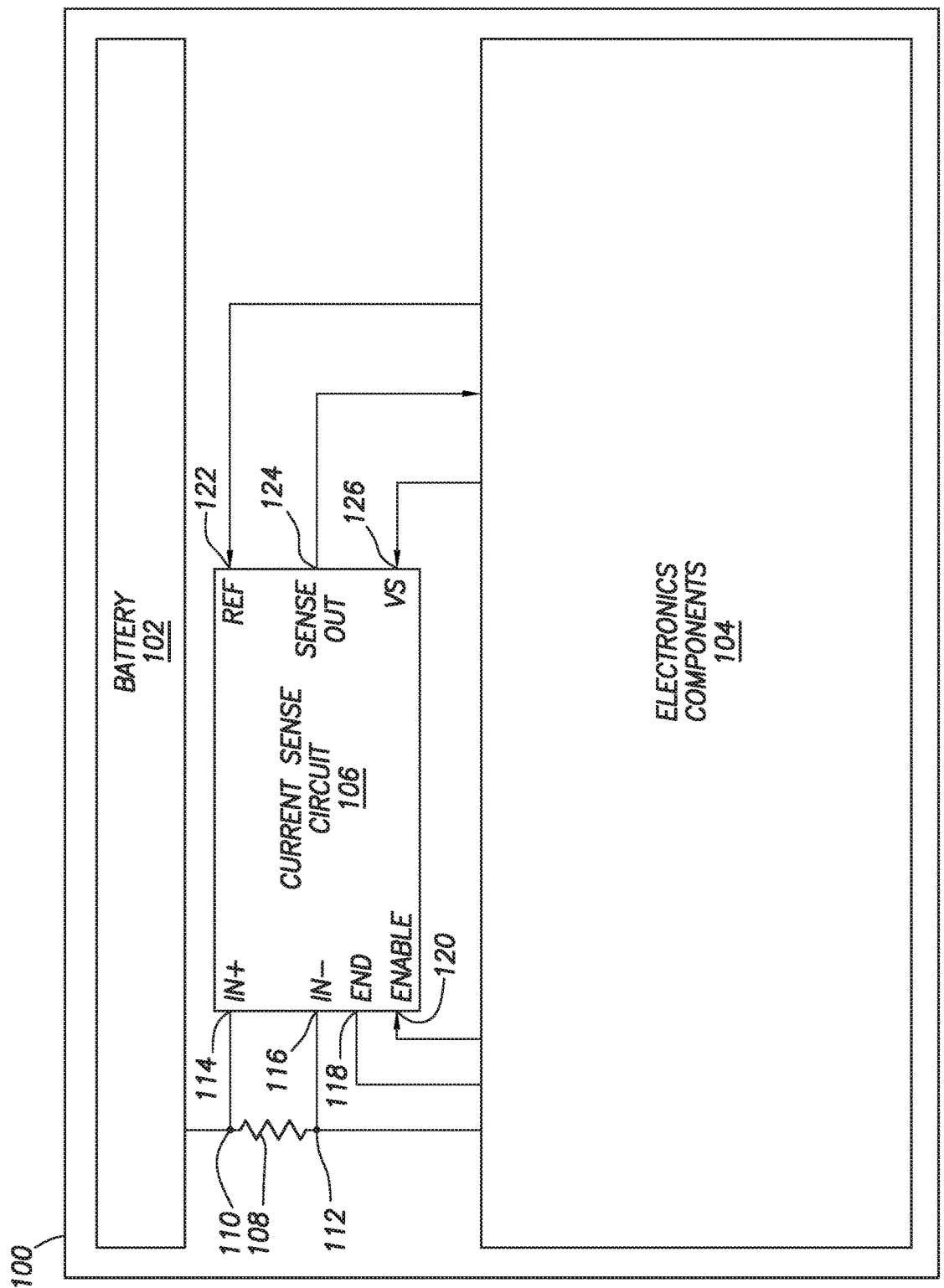
FIG. 1 shows a block diagram of a system in accordance with at least some embodiments.

FIG. 1 shows a block diagram of a system in accordance with at least some embodiments. In particular, the example system 100 comprises a battery 102, electronic components 104, a current sense circuit 106, and a sense resistor 108. The battery 102 may be any currently available battery or battery system, such as a lithium-ion battery or nickel-metal hydride battery, or any after-developed battery or battery system. The battery 102 supplies operational power to the electronic components 104. In many cases, the battery voltage (e.g., 40 Volts (V) at full charge) may be higher than an operating voltage of the electronic components 104 (e.g., 5 Volts (V)). Thus, in some example embodiments the electronic components 104 may include a power converter (not specifically shown) to lower the battery voltage. The electronic components 104 may be any form of electronics that draw power from battery 102, and thus the system 100 may be any of a variety of portable and/or battery-operated devices, such as laptop computers, notebook computers, smart phones, and digital assistants, to name just a few.

In order for the system 100 to make a determination as to the status of the battery 102 during charging or discharging, electrical current to and from the battery 102 may be measured by the current sense circuit 106 in combination with the example sense resistor 108. In particular, the example system 100 comprises sense resistor 108 defining a first lead 110 and a second lead 112. The first lead 110 is coupled to the battery 102 and the second lead 112 is coupled to the load in the form of the electronic components 104. Current flow from the battery 102 to the electronic components 104 produces a voltage across the sense resistor 108 having a first polarity. And current flow from the electronic components 104 to the battery 102 (e.g., during a charge mode) produces a voltage across the sense resistor 108 having a second polarity, opposite the first polarity.

Thus, by sensing current flow through the sense resistor, and respective polarity, the current sense circuit measures the charge and/or discharge state of the battery 102.

Still referring to FIG. 1, the example current sense circuit 106 comprises several pins or terminals that are coupled to external devices and signals. In the example system the example terminals are an IN+ terminal 114, an IN− terminal 116, a ground terminal 118, an enable terminal 120, a reference terminal 122, an output terminal 124, and a voltage supply (VS) terminal 126. Other terminals may also be present but are not shown so as not to unduly complicate the figure. The IN+ terminal 114 couples to the first lead 110 of the sense resistor 108. The IN− terminal 116 couples to the second lead 112 of the sense resistor 108. The sense resistor 108 is coupled in series between the battery 102 and the load in the form of electronic components 104.

The enable terminal 120 is coupled to the electronic components 104 so that the electronic components may selectively enable and disable the current sensing of the current sense circuit 106. For example, the overall device 100 may enter a low power mode, and to conserve the battery 102 the electronic components 104 may disable the current sense circuit 106. In addition to or in place of the lower power mode, the electronic components 104 may only periodically enable the current sense circuit 106 to sense current flow, and extrapolate between readings to estimate power remaining in the battery 102.

In most cases the output terminal 124 of the current sense circuit 106 couples to an analog-to-digital (A/D) converter (not specifically shown) within the electronic components 104 such that the electronic components 104 can read not only the magnitude of the signal produced on the output terminal 124, but also the polarity. The reference terminal 122 couples to a reference voltage produced by the electronic components 104. The reference voltage sets the zero or middle voltage of the voltage and/or current signal produced by the current sense circuit 106. That is, when the current sense circuit 106 is enabled and reading the voltage across the sense resistor 108, when the voltage across the sense resistor 108 is zero, in example systems the signal on the output terminal 124 is the same as the voltage on the reference terminal 122. For example, if the reference voltage is set to 2.5 Volts (V) and the voltage supply terminal 126 is supplied 5 V, then the sense signal driven to the output terminal 124 may rise above 2.5 V for positive currents to the load, and fall below 2.5 V for negative currents. The description now turns to example internal components of the current sense circuit 106.

Figure 2:
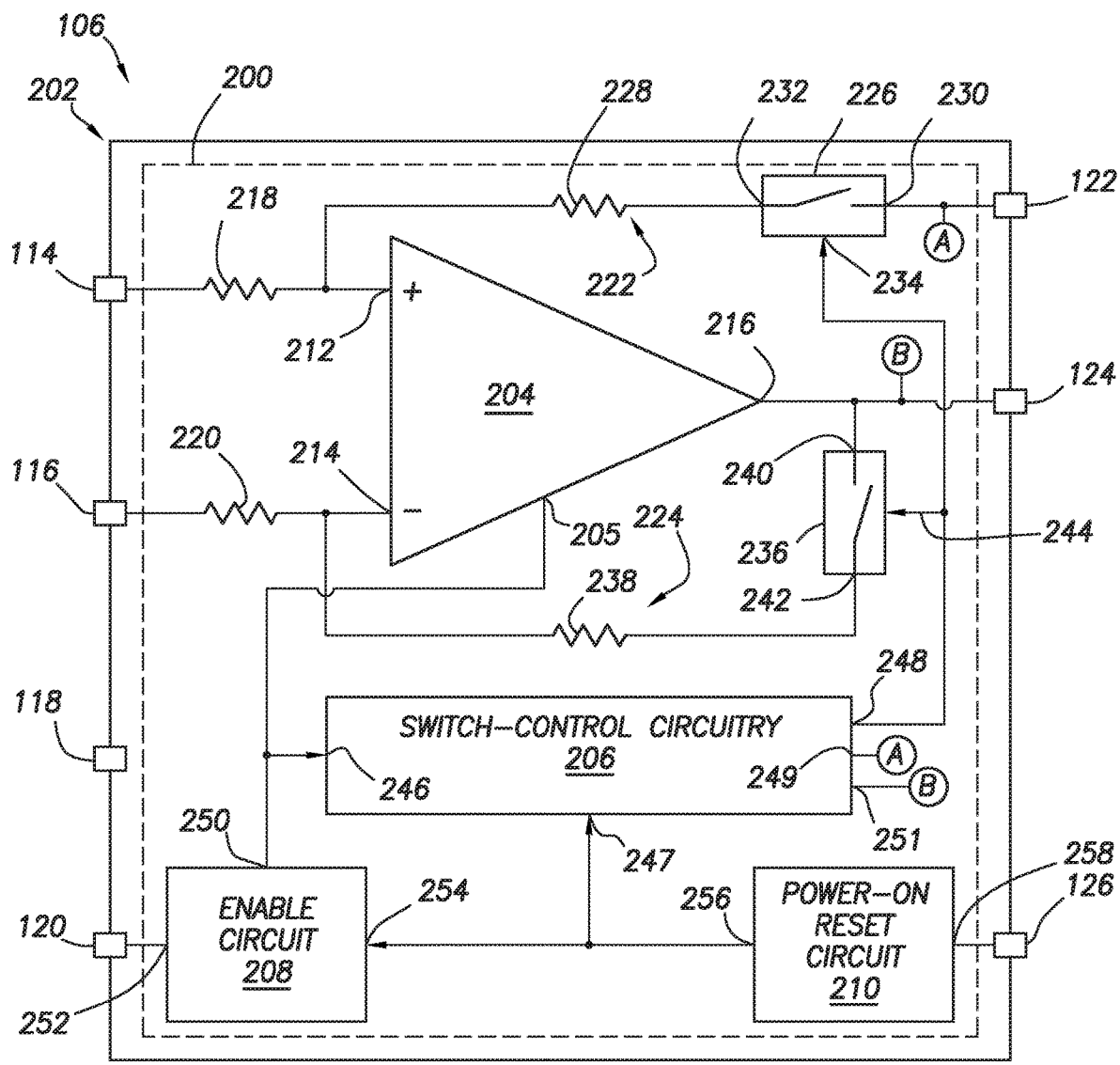
FIG. 2 shows a partial schematic, partial block diagram, of a current sense circuit in accordance with at least some embodiments.

FIG. 2 shows a partial schematic, partial block diagram, of a current sense circuit 106 in accordance with at least some embodiments. In particular, the current sense circuit 106 defines the IN+ terminal 114, the IN− terminal 116, the ground terminal 118, the enable terminal 120, the reference terminal 122, the output terminal 124 and the voltage supply terminal 126. The terminals may be electrical connections to a packaged integrated circuit of any suitable type, such as an eight pin dual in-line package (DIP). Encased within the packaging are one or more substrates of silicon material upon which the various circuits are constructed. In the example shown in FIG. 2, a single silicon substrate 200 is utilized, but two or more silicon substrates may be co-packaged in accordance with other example embodiments. Thus, FIG. 2 shows a current sense integrated circuit 202. Ground terminal 118 would be coupled to electrical circuits within the current sense circuit 106, but the ground connections are not shown in FIG. 2 so as not to unduly complicate the figure. Moreover, voltage supply terminal 126 would likewise be coupled to many electrical circuits beyond the single connection shown, but again those connections are not shown so as not to unduly complicate the figure.

Within the current sense circuit 106 reside several electrical components. For example, the current sense circuit comprises an operational amplifier 204, a switch control circuit 206, an enable circuit 208, and a power-on reset (POR) circuit 210. Each will be discussed in turn, starting with the operational amplifier 204 and related components. In particular, the operational amplifier 204 defines a non-inverting input 212, an inverting input 214, and a sense output 216. The non-inverting input 212 is coupled to the IN+ terminal 114 by way of a resistor 218. The inverting input 214 is coupled to the IN− terminal 116 by way of a resistor 220. The sense output 216 is coupled to the output terminal 124. Finally with respect to the operational amplifier 204, the operational amplifier 204 defines an enable input 205. In example embodiments, and as discussed more below, the operational amplifier 204 may be enabled and disabled responsive to assertion and de-assertion of the enable input 205.

The operational amplifier is associated with a first feedback path 222 and a second feedback path 224. The first feedback path 222 comprises electrically controlled switch 226 and resistor 228. Electrically controlled switch 226 defines a first lead 230, a second lead 232, and a control input 234. In the example shown in FIG. 2 the first lead 230 is coupled to the reference terminal 122 and the second lead 232 is coupled to the resistor 228. Resistor 228 in turn is coupled to the non-inverting input 212. The control input 234 of the electrically controlled switch 226 is coupled to the switch control circuit 206. As will be discussed in greater detail below, the electrically controlled switch 226 acts to de-couple the feedback path 222 during periods of time when the overall current sense circuit 106 is disabled and/or powered off.

The second feedback path 224 comprises electrically controlled switch 236 and resistor 238. Electrically controlled switch 236 defines a first lead 240, a second lead 242, and a control input 244. In the example shown in FIG. 2 the first lead 240 is coupled to the output terminal 124 and the second lead 242 is coupled to the resistor 238. Resistor 238 in turn is coupled to the inverting input 214. The control input 244 of the electrically controlled switch 236 is coupled to the switch control circuit 206. As will be discussed in greater detail below, the electrically controlled switch 236 acts to de-couple the feedback path 224 during periods of time when the overall current sense circuit 106 is disabled and/or powered off.

Still referring to FIG. 2, the example current sense circuit 106 further comprises the switch control circuit 206. The switch control circuit 206 defines an enable input 246, a POR input 247, a reference input 249, a gate input 251, and a switch output 248. The enable input 246 of the switch control circuit 206 is coupled to the internal enable output 250 of the enable circuit 208. The POR input 247 is coupled to a POR output 256 of the POR circuit 210. The switch output 248 is coupled to control inputs 234 and 244 of the electrically controlled switches 226 and 236, respectively. As will be discussed in more detail below, the switch control circuit 206 is configured to assert the switch output 248 to make the electrically controlled switches 226 and 236 conductive responsive to assertion of the internal enable output 250. Moreover, the switch control circuit 206 is configured to de-assert the switch output 248 to make the electrically controlled switches 226 and 236 non-conductive responsive to de-assertion of the internal enable output 250. The reference input 249 is coupled to the reference terminal 122 (as shown by bubble "A"), and the gate input 251 is coupled to the gate terminal 124 (as shown by bubble "B").

The example current sense circuit 106 further comprises the enable circuit 208 defining an enable input 252, a power input 254, and the internal enable output 250. The enable input 252 is coupled to the enable terminal 120. The power input 254 is coupled to the POR output 256 of the POR circuit 210. The internal enable output 250 is coupled to the operational amplifier 204 and switch control circuit 206 as discussed above. The example enable circuit 208 is configured to assert the internal enable output 250 when both the enable input 252 and power input 254 are asserted, otherwise the internal enable output 250 is de-asserted.

Still referring to FIG. 2, the example current sense circuit 106 further comprises the POR circuit 210 defining a sense input 258 and the POR output 256. The sense input 258 is coupled to the voltage supply terminal 126. The POR output 256 is coupled to the enable circuit 208 and the switch control circuit 206 as discussed above. The POR circuit 210 configured to assert the POR output 256 when voltage on the voltage supply terminal 126 exceeds a predetermined value.

The current sense circuit 106 can be considered to have two modes of operations. In a first mode, the current sense circuit senses current flow through the sense resistor 108 (FIG. 1) by way of the operational amplifier 204. In the mode where the current sense circuit 106 is sensing current, the feedback path 222 and feedback path 224 are operational. Stated differently, in the mode where the current sense circuit 106 is sensing current, the electrically controlled switches 226 and 236 are conductive, such that the feedback paths 222 and 224 are operational. During periods of time when the current sense circuit 106 is sensing current, the operational amplifier 204 drives a signal to the sense output 216 and thus the output terminal 124. The signal driven by the operational amplifier 204 is proportional to the magnitude and polarity of the current flow through the sense resistor 108. In example embodiments, the current sense circuit 106 senses current when the voltage on the voltage supply terminal 126 is above a predetermined value (as determined by the POR circuit 210) and the enable terminal 120 is asserted (as determined by the enable circuit 208).

However, the overall system 100 (FIG. 1), in which the current sense circuit 106 is implemented, may periodically disable the current sense circuit 106, such as by de-asserting the enable terminal 120. Similarly, the overall system 100 may enter a low power mode and/or shut down, causing one or both the enable terminal 120 to be de-asserted and the supply voltage on the voltage supply terminal 126 to be lost. The discussion continues under the assumption that the enable terminal 120 is de-asserted and power on the voltage supply terminal 126 remains.

In example systems, when the enable terminal 120 is de-asserted, the current sense circuit 106 enters a second mode in which the current sense circuit 106 is disabled. In at least some embodiments, disabling involves disconnecting and/or de-coupling the feedback paths 222 and 224. In particular, in example embodiments when the enable terminal 120 is de-asserted the current sense circuit 106 de-couples feedback path 222 from the reference terminal 122, and de-couples feedback path 224 from the output terminal 124. More particularly still, in example embodiments when the enable terminal 120 is de-asserted the current sense circuit 106 de-couples feedback path 222 from the reference terminal 122 by making electrically controlled switch 226 non-conductive, and de-couples feedback path 224 from the output terminal 124 by making electrically controlled switch 236 non-conductive. Stated differently, the current sense circuit 106 is configured to make the electrically controlled switches 226 and 236 conductive responsive to assertion of the enable terminal 120, and the current sense circuit 106 is configured to make the electrically controlled switches 226 and 236 non-conductive responsive to de-assertion of the enable terminal 120. Disabling the feedback paths 222 and 224 in this way ensures that, during periods of time when the enable terminal 120 is de-asserted, no unwanted or parasitic current may flow in or through the feedback paths 222 and 224.

In example systems the switch control circuit 206, by way of the switch output 248, selectively makes the electrically controlled switches 226 and 236 conductive and non-conductive responsive to assertion and de-assertion of the enable terminal 120, respectively. The nature of the signals driven on the switch output 248 are dependent upon the nature of the electrically controlled switches 226 and 236, and example switch control circuits 206 are discussed in greater detail below. Before delving into example electrically controlled switches, in example cases the electrically controlled switches 226 and 236 may be considered "normally open" switches in the sense that, when no power is provided to the current sense circuit 106 the electrically controlled switches 226 and 236 are non-conductive.

Figure 3:
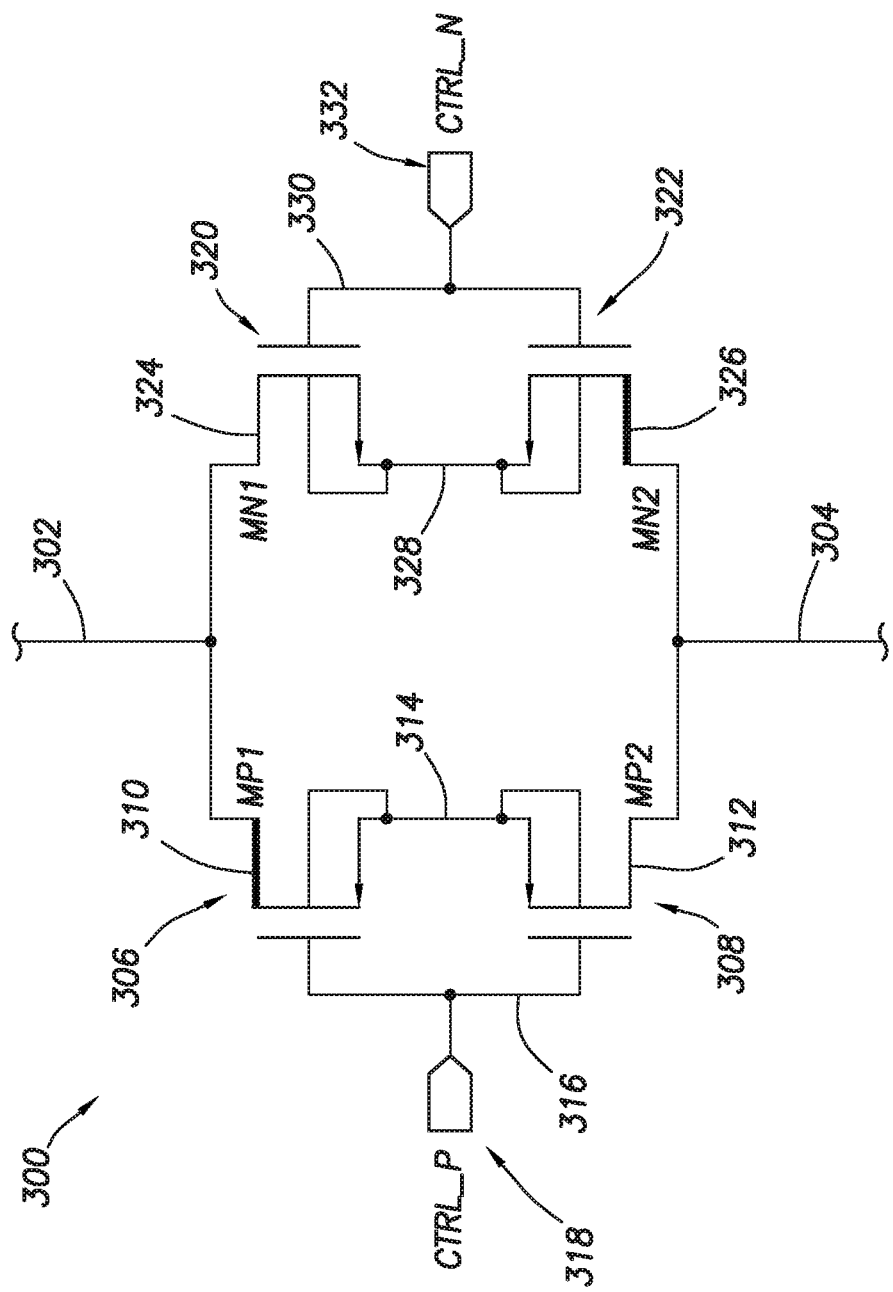
FIG. 3 shows an electrically controlled switch in accordance with at least some embodiments.

FIG. 3 shows an electrically controlled switch in accordance with at least some embodiments. In particular, the electrically controlled switch 300 of FIG. 3 is representative of either electrically controlled switch 226 or electrically controlled switch 236. The example electrically controlled switch 300 defines a first lead 302 and a second lead 304. When the electrically controlled switch 300 is conductive, current may flow from the first lead 302 to the second lead 304, and vice versa. It follows that the polarity of the voltage across the example electrically controlled switch 300 may be positive or negative at any given time. The example electrically controlled switch 300 is created by four field effect transistors (FETS). In particular, the example electrically controlled switch 300 includes two P-channel metal oxide semiconductor (PMOS) FETs 306 (MP1) and 308 (MP2) coupled back to back. The drain 310 of FET 306 couples to the first lead 302, and the drain 312 of FET 308 couples to the second lead 304. The sources 314 are coupled together as shown. Similarly, the gates 316 of the FETS 306 and 308 are coupled together and define a first control input 318 (illustratively labelled CTRL_P). When the control input 318 has a low voltage the FETS 306 and 308 are conductive, and oppositely when the control input 318 has a high voltage the FETS 306 and 308 are non-conductive. In the example system the FET 306 is a high voltage FET (e.g., having the ability to withstand a drain-to-source voltage of greater than 5V), and the FET 308 may be a low voltage FET (e.g., having the ability to withstand a drain-to-source voltage of 5V and less).

The example electrically controlled switch 300 also comprises two N-channel MOS (NMOS) FETs 320 (MN1) and 322 (MN2) coupled back to back. The drain 324 of FET 320 couples to the first lead 302, and the drain 326 of FET 322 couples to the second lead 304. The sources 328 are coupled together as shown. Similarly, the gates 330 of the FETS 320 and 322 are coupled together and define a second control input 332 (illustratively labelled CTRL_N). When the control input 332 has a low voltage, the FETS 320 and 322 are non-conductive, and oppositely when the control input 332 has a high voltage the FETS 320 and 322 are conductive. In the example system the FET 322 is a high voltage FET (e.g., having the ability to withstand a drain-to-source voltage of greater than 5V), and the FET 320 may be a low voltage FET (e.g., having the ability to withstand a drain-to-source voltage of 5V and less).

In operation then, an example switch control circuit 206 (FIG. 2) generates the control signals CTRL_P and CTRL_N to appropriately drive the FETs of the example electrically controlled switch 300. That is, in the example situation the switch output 248 is actually two separate signals—a CTRL_P signal and a CTRL_N signal. When the example electrically controlled switch 300 is conductive, all four FETs are conductive, and when the example electrically controlled switch 300 is non-conductive, all four FETs are non-conductive. It follows that when the example electrically controlled switch 300 is conductive, the CTRL_P signal is a low voltage and the CTRL_N signal is high voltage, and when the example electrically controlled switch 300 is non-conductive the CTRL_P signal is a high voltage and the CTRL_N signal is a low voltage. The specification now turns to an example switch control circuit 206 configured to provide the control signals to appropriately drive the example electrically controlled switch 300.

Figure 4:
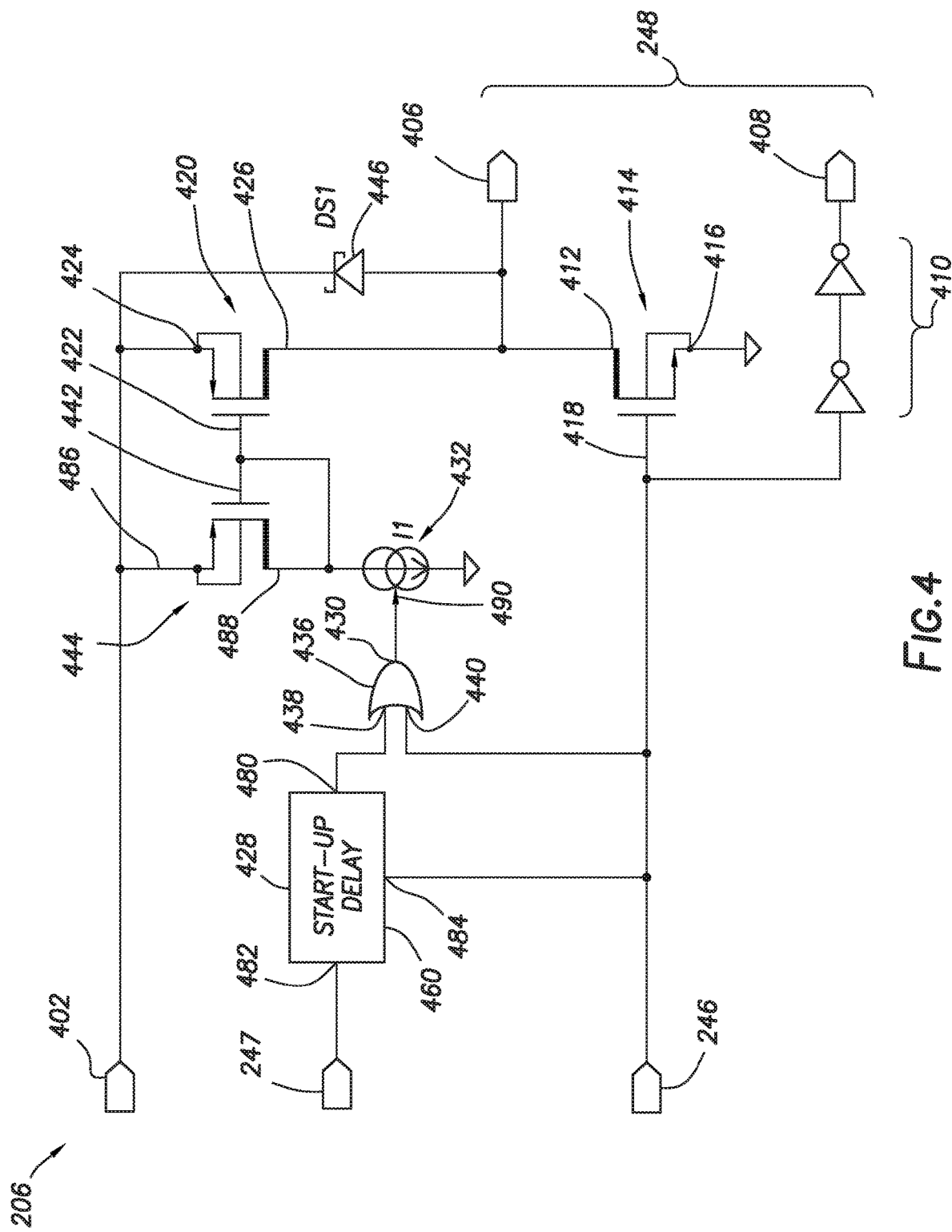
FIG. 4 shows a switch control circuit in accordance with at least some embodiments.

FIG. 4 shows a switch control circuit in accordance with at least some embodiments. In particular, the example switch control circuit 206 defines enable input 246, a reference supply voltage input 402, the POR input 247, a P output 406, and an N output 408. The P output 406 and the N output 408 collectively define the switch output 248 in this example circuit, and are thus coupled to the electrically controlled switches such as shown in FIG. 3. In particular, the P output 406 couples to the control input 318 (FIG. 3) of the electrically controlled switches, and the N output 408 couples to the control input 332 (FIG. 3) of the electrically controlled switches. The N output 408 has a voltage range from the ground on the ground terminal 118 (FIG. 1) to the voltage on the voltage supply terminal 126 (FIG. 1). The P output 406, by contrast, ranges between ground on the ground terminal 118 and a common-mode voltage experienced by the sense resistor 108 (FIG. 1), as illustrated by the reference supply voltage input 402 which represents the maximum value between the voltage supply terminal 126 (FIG. 1) and the common-mode voltage of the sense resistor 108 (FIG. 1). In some cases the common-mode voltage is the voltage of the battery 102 (FIG. 1), which may be higher (e.g., 40 V) than the voltage on the voltage supply terminal 126 (e.g., 5 V).

The internal enable signal applied to the enable input 246 is coupled to an even number of logic NOT buffers 410 coupled in series between the enable input 246 and the N output 408. It follows that the N output 408 tracks the internal enable signal produced by the enable control circuit 208 (FIG. 2) and applied to the enable input 246. The P output 406 couples the drain 412 of a FET 414, and the source 416 of the FET 414 couples to ground. The gate 418 of the FET 414 couples to the internal enable signal on the enable input 246. Thus, when the internal enable signal on the enable input 246 is high, the P output 406 is grounded through the FET 414.

Still referring to FIG. 4, the P output 406 is further coupled to the reference supply voltage input 402 through a FET 420. The FET 420 defines a gate 422, a source 424, and a drain 426. The source 424 couples to the reference supply voltage input 402, the drain 426 couples to the P output 406, and the gate 422 couples to a controlled current source 432. Another FET 444 defines a gate 442, a source 486, and a drain 488. The source 486 couples to the reference supply voltage input 402, and the drain 488 couples to the controlled current source 432.

The startup delay circuit 428 defines a POR input 482, an enable input 484, and a control output 480. The POR input 482 couples to POR signal by way of the POR input 247. The enable input 484 couples to the internal enable signal on the enable input 246. The control output 480 couples to the first input 438 of logic OR gate 436. The second input 440 of the logic OR gate 436 couples to the internal enable signal on the enable input 246. The gate output 430 couples to the control input 490 of the controlled current source 432.

Consider, that initially the internal enable signal is asserted, and thus the P output 406 is a low voltage (grounded through FET 414), the N output 408 is a high voltage, and thus example electrically controlled switch 300 of FIG. 3 is conductive. Further in this state, the FETs 420 and 444 are non-conductive, implying that their gates 422 and 442 are at a high voltage and the controlled current source 432 is off and driving no current. It follows that when the control input 490 of the controlled current source 432 is asserted (because the internal enable signal on enable input 246 is asserted through the logic OR gate 436), the controlled current source 432 is off and driving no current.

Now consider that the electronic components 104 (FIG. 1) decide to enter a low power mode, and thus the enable terminal 120 (FIG. 2) is de-asserted while the voltage on the voltage supply terminal 126 remains nominal. By operation of the enable control circuit 208 (FIG. 2), the internal enable signal applied to the enable input 246 is de-asserted (in this example, goes low). The N output 408 likewise goes low by operation of logical NOT buffers 410. Likewise, FET 414 becomes non-conductive thus disconnecting the P output 406 from ground. Because the enable input 246 goes low, and initially the control output 480 of the startup delay circuit 428 is de-asserted, the gate output 430 of the logical OR gate 436 goes low, enabling the controlled current source 432. When the controlled current source 432 is enabled, the current pulls down the gate 422 of the FET 420. Likewise, the controlled current source 432 pulls down the gate 442 of FET 444, and thus both FETs 420 and 444 become conductive, thus applying the voltage from the common-mode input 402 to the P output 406.

In some cases, the FETs 420 and 444 remain conductive the entire time the internal enable signal is de-asserted. However, current drawn through the P output 406 is very low as all the downstream devices are isolated gates of FETs. Thus, the FETs 420 and 444 may be made non-conductive once the P output 406 reaches the voltage of the common-mode input 402, and yet the P output 406 remains high. In particular, in the example case of FIG. 4, a predetermined amount of time after the controlled current source 432 is enabled, the start-up delay circuit 428 asserts (here drives high) the control output 480, which asserts the gate output 430 and turns off the controlled current source 432. Because of leakage currents the gates 422 and 442 drift high again, making the FETs 420 and 444 non-conductive. In order to ensure the leakage currents do not drain the voltage on the P output 406, a Schottky diode 446 has its anode coupled to the P output 406 and its cathode coupled to the common mode voltage input 402 such that bleed current through the Schottky diode 446 keeps the P output 406 at the voltage level of the common-mode input 402. Other devices may be used to equalize or substantially equalize the voltages as between the voltage on the common-mode input 402 and the P output 406, for example, a high value resistance or depletion NMOS devices. Thus, the switch control circuit 206 provides the P output 406 and N output 408 to drive the electrically controlled switches 226 and 236 (FIG. 2) when those electrically controlled switches are implemented as in FIG. 3.

And to come full circle, consider that the electronic components 104 (FIG. 1) decide again to enable the current sense circuit 106 (FIG. 2). The enable terminal 120 (FIG. 2) is asserted, the enable circuit 208 asserts the internal enable signal on the enable input 246, the P output 406 is grounded through FET 414, and the N output 408 is driven high through buffers 410. The electrically controlled switch 300 of FIG. 3, and corresponding switch control circuit 206 of FIG. 4, are but one example of circuits to perform the recited functions. Other electrically controlled switch configurations, and switch control circuits, are possible, such as those shown in FIG. 5.

Figure 5:
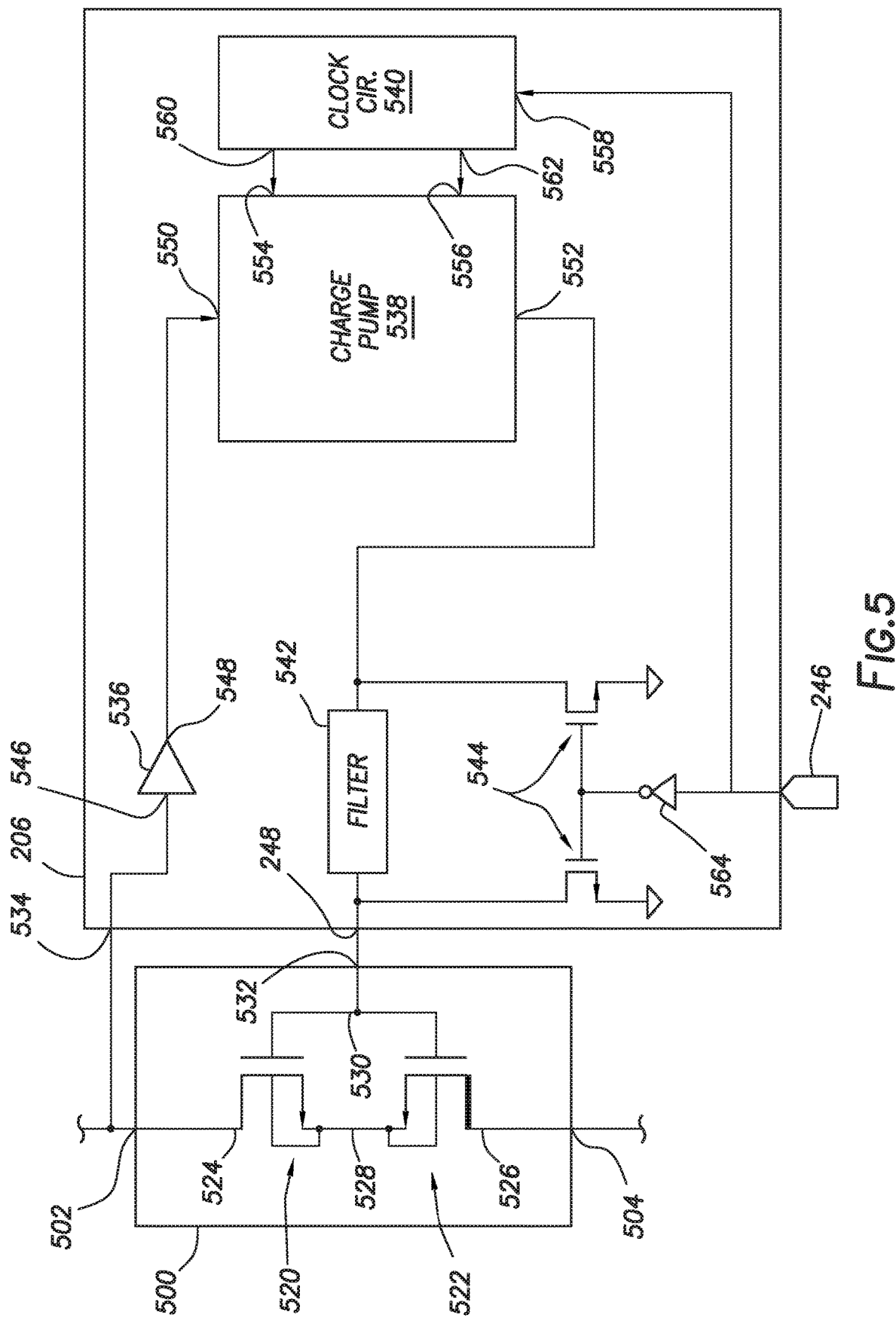
FIG. 5 shows an electrical schematic of an electrically controlled switch and corresponding switch control circuit in accordance with at least some embodiments.

FIG. 5 shows an electrical schematic of an electrically controlled switch and corresponding switch control circuit in accordance with at least some embodiments. In particular, FIG. 5 shows an example electrically controlled switch 500. The electrically controlled switch 500 of FIG. 5 is representative of either electrically controlled switch 226 or electrically controlled switch 236. The example electrically controlled switch 500 defines a first lead 502 and a second lead 504. When the electrically controlled switch 500 is conductive, current may flow from the first lead 502 to the second lead 504, and vice versa. It follows that the polarity of the voltage across the example electrically controlled switch 500 may be positive or negative at any given time.

The example electrically controlled switch 500 is created by two FETs. In particular, the example electrically controlled switch 500 includes two NMOS FETs 520 and 522 coupled back to back. The drain 524 of FET 520 couples to the first lead 502, and the drain 526 of FET 522 couples to the second lead 504. The sources 528 are coupled together as shown. Similarly, the gates 530 of the FETs 520 and 522 are coupled together and define a control input 532. When the control input 532 has a low voltage, the FETs 520 and 522 are non-conductive, and oppositely when the control input 532 has a high voltage the FETs 520 and 522 are conductive. In the example system the FET 522 is a high voltage FET (e.g., having the ability to withstand a drain-to-source voltage of greater than 5V), and the FET 520 may be a low voltage FET (e.g., having the ability to withstand a drain-to-source voltage of 5V and less). In operation then, the switch control circuit 206 generates the control signal to appropriately drive the FETs of the example electrically controlled switch 500. The specification now turns to an example switch control circuit 206 configured to provide the control signals to appropriately drive the example electrically controlled switch 500.

FIG. 5 further shows an example switch control circuit 206 configured specifically to drive the example electrically controlled switch 500. In particular, the example switch control circuit 206 of FIG. 5 defines enable input 246, a voltage input 534, and the switch output 248. The enable input 246 couples to the internal enable output 250 (FIG. 2) of the enable circuit 208 (FIG. 2), and thus couples to the internal enable signal. The voltage input 534 is coupled to the first lead 502. The switch output 248 couples the control input 532 of the example electrically controlled switch 500.

Internally, the example switch control circuit 206 defines a buffer 536, a charge pump 538, a clock circuit 540, a filter 542, and a set of grounding FETs 544. Each will be discussed in turn. The buffer 536 defines a buffer input 546 coupled to the voltage input 534, and a buffer output 548 coupled to the charge pump 538. The charge pump 538 defines a voltage input 550, a voltage output 552, a first clock input 554, and a second clock input 556. The voltage input 550 is coupled to the buffer output 548. The voltage output 552 is coupled to switch output 248 (by way of the filter 542, discussed more below). The first and second clock inputs 554 and 556 are coupled to the clock circuit 540.

Clock circuit 540 defines an enable input 558, a first clock output 560, and a second clock output 562. The enable input 558 is coupled to the enable input 246. The first clock output 560 is coupled to the first clock input 554 of the charge pump 538. The second clock output 562 is coupled to the second clock input 556 of the charge pump 538. Filter 542 couples between the voltage output 552 and the switch output 248, and as the name implies may filter the voltage and current provided from the charge pump 538. Finally, grounding FETs 544 are illustratively shown as NMOS FETs having their drains coupled to respective sides of the filter 542, and the sources coupled to the ground. The gates are coupled to the enable input 246 by way of logic NOT gate 564. If the filter 542 is omitted, one of the FETs 544 be omitted as well.

The example switch control circuit 206 of FIG. 5 is designed and constructed to assert the switch output 248 responsive to assertion of the enable input 246. And oppositely, the switch control circuit 206 of FIG. 5 is designed and constructed to de-assert the switch output 248 responsive to de-assertion of the enable input 246. In the example system, assertion and de-assertion of the switch output 248 is controlled by a combination of the grounding FETs 544 and the control of the charge pump 538. More specifically, to enable making the FETs of the example electrically controlled switch 500 fully conductive (taking into account the common mode voltages that may be experienced), the gates 530 need to be driven above (e.g., 1.7 to 1.8 V above) the threshold voltage of the NMOS FETs 520 and/or 522. In order to ensure sufficient voltage is provided, in the example switch control circuit 206 the voltage on voltage input 534 is provided (through the buffer 536) to the charge pump 538. The charge pump 538, in turn, boosts the voltage provided to the switch output 248 during periods of time when the enable input 246 is asserted. More particularly still, in the example switch control circuit 206 of FIG. 5 when the enable input 246 is asserted the clock circuit 540 produces clock signals on clock outputs 560 and 562 to drive the charge pump 538, where the charge pump may take any suitable form. Moreover, when the enable input 246 is asserted the set of FETs 544 are non-conductive, and thus the voltage produced at the voltage output 552 by the charge pump 538 passes through the filter 542 to the switch output 248. The voltage produced at the voltage output 552 may be controlled by parameters of the clock signals, such as frequency, pulse width, and amount of overlap of the signals. In example cases, the clock circuit 540 produces clock signals having a frequency of about 3 MegaHertz, opposite phase, and the clock signals may on each respective transition. Other parameters may be used depending on the situation.

When the enable input 246 is de-asserted, the set of FETs 544 ground the switch output 248, and the clock circuit 540 ceases producing clock signals to thus disable the charge pump. The description now turns to disabling of the operational amplifier 204 (FIG. 2) in accordance with at least some embodiments.

Returning momentarily to FIG. 2, in accordance with some example embodiments the current sense circuit 106 is disabled solely by de-coupling the feedback paths 222 and 224 as discussed to this point. However, in other cases, in addition to or in place of de-coupling the feedback paths 222 and 224 certain steps may be taken with respect to the operational amplifier 204 to likewise ensure that no parasitic currents flow through the operational amplifier during periods of time when then current sense circuit 106 is disabled. In order to discuss disabling as it relates to the operational amplifier 204, the discussion turns to a more detailed description of the operational amplifier 204.

Figure 6:
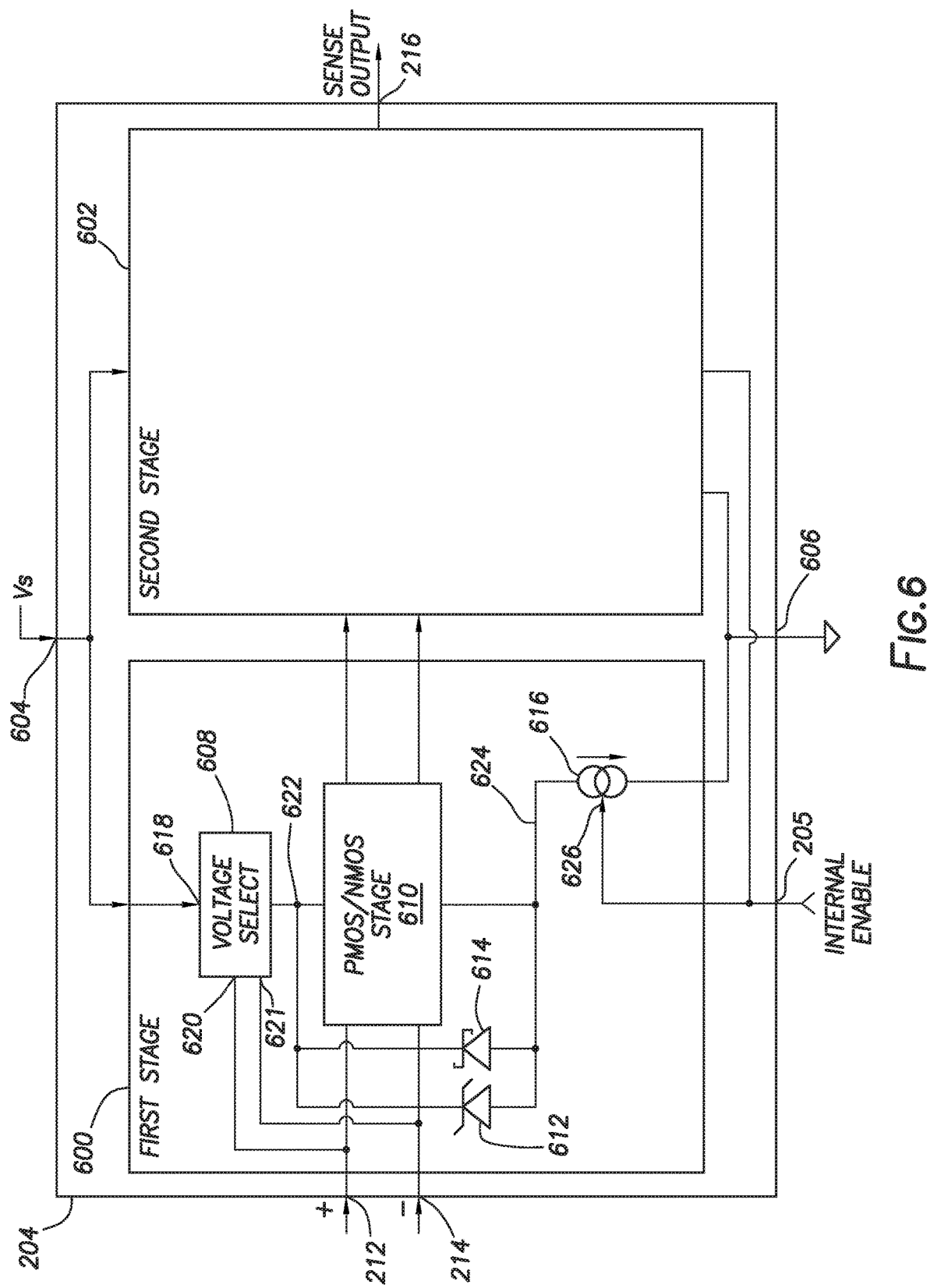
FIG. 6 shows a partial schematic, partial block diagram, of an operational amplifier in accordance with example embodiments.

FIG. 6 shows a block diagram of an operational amplifier in accordance with example embodiments. In particular, the operational amplifier 204 comprises an input or first stage 600 and an output or second stage 602. The operational amplifier 204 defines a voltage source (VS) input 604 and a ground connection 606, as well as the enable input 205, non-inverting input 212, the inverting input 214, and the sense output 216. The VS input 604 is coupled to the voltage supply terminal 126 (FIG. 2), the ground connection 606 is coupled to the ground terminal 118 (FIG. 2), and the enable input 205 is coupled to the enable circuit 208 (FIG. 2).

The operational amplifier 204 is conceptually divided into the first stage 600 and the second stage 602 to acknowledge that the common-mode voltage experienced by the operational amplifier 204 can be high. That is, the voltage at the non-inverting input 212 and inverting input 214, while likely only a few millivolts apart, can still be higher than the voltage on the VS input 604 coupled to the voltage supply terminal 126 (FIG. 2). Thus, the first stage 600 is designed and constructed to operate in the range of voltages applied to the inverting and non-inverting inputs, while the second stage 602 is designed and constructed to operate in the realm of the voltage on the VS input 604. In example systems, the second stage 602 may be enabled and disabled responsive to assertion and de-assertion, respectively, of the enable input 205. Likewise, the input stage 600 may be enabled and disabled responsive to assertion and de-assertion, respectively, of the enable input 205. Because the first stage 600 is designed and constructed to operate in the realm of the common-mode voltage, enabling and disabling is more involved.

The example first stage 600 of FIG. 6 comprises a voltage select circuit 608, a PMOS/NMOS stage 610 (hereafter just amplifier stage 610), a Zener diode 612, a Schottky diode 614, and a controlled current source 616. The voltage select circuit 608 defines a voltage input 618, common-mode inputs 620 and 621, and a first stage voltage rail 622. The voltage input 618 is coupled to the VS input 604, and thus the voltage on the voltage supply terminal 126 (FIG. 2). The common-mode inputs 620 and 621 is coupled to the non-inverting input 212 and inverting input 214, respectively. The voltage select circuit 608 controls the voltage on the first stage voltage rail 622. In particular, the voltage select circuit 608 is designed and constructed to force the first stage voltage rail 622 to be the higher of the common mode voltage on the common-mode input 620 or the voltage on the voltage input 618. Thus, when the common mode voltage is high, the amplifier stage 610 uses the common-mode voltage as the upper voltage for amplification. And when the common mode voltage is lower than the voltage on the voltage input 618, the amplifier stage 610 uses the voltage on the voltage supply terminal 126 as the upper voltage for amplification.

As for a ground or common for the amplifier stage 610, example first stage 600 also defines a first stage ground 624 coupled to the amplifier stage 610. The Zener diode 612 has an anode coupled to the first stage ground 624 and a cathode coupled to the first stage voltage rail 622. Similarly, the Schottky diode 614 has an anode coupled to the first stage ground 624 and a cathode coupled to the first stage voltage rail 622. The controlled current source 616 has a first connection coupled to the first stage ground 624, and a second connection coupled to the ground connection 606. The control input 626 of the controlled current source 616 is coupled to the enable input 205.

The example systems set the relative voltage between the first stage voltage rail 622 and the first stage ground 624 by way of Zener diode 612 and controlled current source 616. That is, when the controlled current source 616 is enabled by way of its enable input 205, current flow through the controlled current source 616 creates a reverse current flow and a voltage across the Zener diode 612 (the voltage being the breakdown voltage of the Zener diode 612). Thus, when the controlled current source 616 is operational, voltage as between the first stage voltage rail 622 and the first stage ground 624 is controlled or set by the breakdown voltage of the Zener diode 612.

Disabling the operational amplifier 204 may have two components. First, when the enable input 205 is de-asserted, the second stage 602 is disabled in any suitable form, such as removing the supply voltage. The second component is disabling the first stage 600 in such a way as to reduce or eliminate unwanted current flow through the non-inverting input 212 and inverting input 214. In particular, disabling the first stage 600 may involve electrically floating the first stage 600, and forcing voltage on the first stage voltage rail 622 to be within a predetermined threshold voltage of the first stage ground 624. In the example embodiments, electrically floating the first stage 600 involves disabling or turning off the controlled current source 616 responsive to de-assertion of the enable input 205. Once the controlled current source 616 is disabled and thus conducting no current, the voltages as between the first stage ground 624 and ground connection 606 are no longer tied together, and thus allowed to swing or float. Once the first stage ground 624 is electrically floated, the voltage on the first stage ground 624 is pulled to be the same or approximately the same as the first stage voltage rail 622. In the example system of FIG. 6, pulling the first stage ground 624 up to a voltage on the first stage voltage rail 622 is accomplished by way of a Schottky diode 614. That is, when the first stage ground 624 is electrically floating but lower than the first stage voltage rail 622, reverse current flow through the Schottky diode 614 substantially equalizes the voltages so that there is little or no current flow into the first stage 600. Other devices may be used to equalize or substantially equalize the voltages as between the first stage voltage rail 622 and the first stage ground 624, such as a high value resistance, depletion NMOS devices, or electrically controlled switch.

Figure 7:
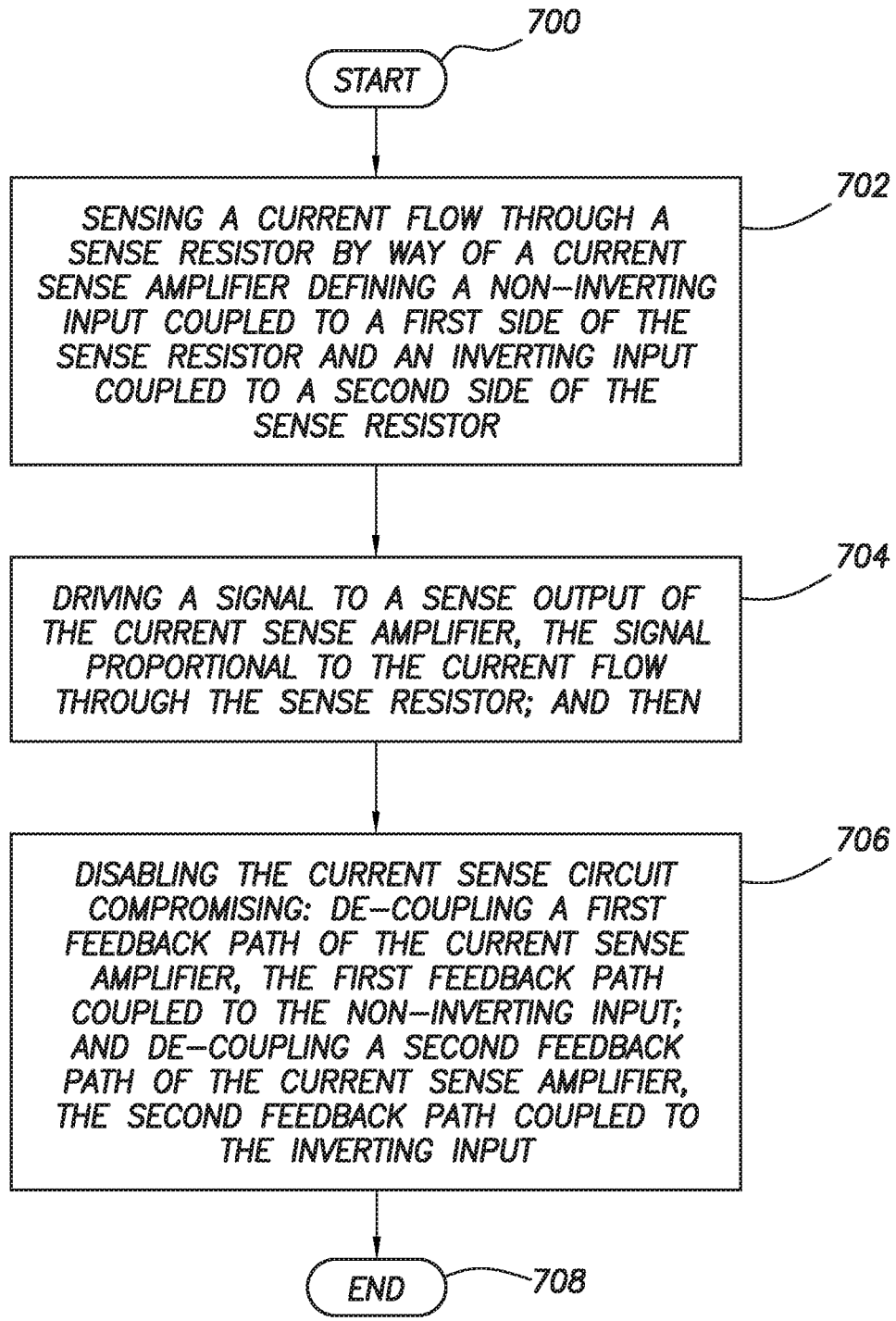
FIG. 7 shows a method in accordance with at least some embodiments.

FIG. 7 shows a method in accordance with at least some embodiments. In particular, the method starts (block 700) and includes: sensing a current flow through a sense resistor by way of a operational amplifier defining a non-inverting input coupled to a first side of the sense resistor and an inverting input coupled to a second side of the sense resistor (block 702); driving a signal to a sense output of the operational amplifier, the signal proportional to the current flow through the sense resistor (block 704); and then disabling the current sense circuit comprising: de-coupling a first feedback path of the operational amplifier, the first feedback path coupled to the non-inverting input; and de-coupling a second feedback path of the operational amplifier, the second feedback path coupled to the inverting input (block 706). Thereafter the method ends (block 708).

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications

The invention claimed is:

1. A method of operating a current sense circuit, comprising:
sensing a current flow through a sense resistor by way of an operational amplifier;
driving a signal to a sense output of the operational amplifier, the signal proportional to the current flow through the sense resistor; and then
disabling the current sense circuit by de-coupling a first feedback path of the operational amplifier, and de-coupling a second feedback path of the operational amplifier.

2. The method of claim 1 wherein disabling the current sense circuit further comprises disabling an input stage of the operational amplifier.

3. The method of claim 2 wherein disabling the current sense circuit further comprises:
electrically floating an input stage ground; and
forcing a voltage on an input stage voltage rail to be within a predetermined threshold voltage of the input stage ground.

4. The method of claim 3 wherein electrically floating the input stage ground further comprises disabling a controlled current source coupled between the input stage ground and an output stage ground of the operational amplifier.

5. The method of claim 3 wherein forcing the voltage on the input stage voltage rail further comprises conducting current through a diode.

6. The method of claim 1:
wherein de-coupling the first feedback path further comprises de-coupling the first feedback path from a reference terminal of the current sense circuit; and
wherein de-coupling the second feedback path further comprises de-coupling the second feedback path from the sense output of the operational amplifier.

7. The method of claim 1 wherein de-coupling the first feedback path further comprises making a first electrically controlled switch non-conductive, the first electrically controlled switch in the first feedback path.

8. The method of claim 7 wherein de-coupling the second feedback path further comprises making a second electrically controlled switch non-conductive, the second electrically controlled switch in the second feedback path.

9. The method of claim 7 wherein sensing the current flow through the sense resistor further comprises coupling the first feedback path to a non-inverting input of the operational amplifier.

10. The method of claim 9 wherein sensing the current flow through the sense resistor further comprise coupling the second feedback path to an inverting input of the operational amplifier.

11. A current sense integrated circuit comprising:
a first input terminal, and a second input terminal, a reference terminal, an output terminal, an enable terminal, and a ground terminal;
an amplifier coupled to the first and second input terminals, the amplifier defining a sense output coupled to the output terminal;
a first feedback path coupled between the reference terminal and the amplifier;
a second feedback path coupled between the sense output and the amplifier; and
the current sense integrated circuit configured to make the first and second feedback paths conductive responsive to assertion of the enable terminal, and the current sense integrated circuit configured to make the first and second feedback paths non-conductive responsive to de-assertion of the enable terminal.

12. The current sense integrated circuit of claim 11 wherein the operational amplifier further comprises:
a first stage defining a first stage voltage rail, a first stage ground, and a first stage output;
a second stage defining a second stage ground;
a controlled current source coupled between the first stage ground and the second stage ground; and
a diode coupled between the first stage voltage rail and the first stage ground;
the current sense integrated circuit configured to electrically float the first stage ground with respect to the second stage ground by disabling the controlled current source, and further configured to force a voltage on the first stage voltage rail to be within a predetermined threshold voltage of the first stage ground.

13. The current sense integrated circuit of claim 11 further comprising:
a power terminal;
a power-on reset (POR) circuit defining a sense input and a POR output, the sense input coupled to the power terminal, the POR circuit configured to assert the POR output when voltage on the power terminal exceeds a predetermined value;
an enable circuit defining an enable input, a power input, and an internal enable output, the enable input coupled to the enable terminal, and the power input coupled to the POR output, the enable circuit configured to assert the internal enable output when both the enable input and power input are asserted;
a switch control circuit defining an enable input and a switch output, the enable input of the switch control circuit coupled to the internal enable output, and the switch output coupled to control inputs of the first and second feedback paths;
the switch control circuit configured to assert the switch output to make the first and second feedback paths conductive responsive to assertion of the internal enable output, and configured to de-assert the switch output to make the first and second feedback paths non-conductive responsive to de-assertion of the internal enable output.

14. The current sense integrated circuit of claim 13 wherein the first feedback path comprises a first electrically controlled switch.

15. The current sense integrated circuit of claim 14 wherein the second feedback path comprises a second electrically controlled switch, distinct from the first electrically controlled switch.

16. A system comprising:
a battery;
a load;
a sense resistor coupled between the battery and the load;
a current sense circuit comprising:
an enable input;

an amplifier coupled to the sense resistor, the operational amplifier defining a sense output;
a first feedback path coupled between operational amplifier and a reference terminal;
a second feedback path coupled between the operational amplifier and the sense output; and
the current sense circuit configured to make the first and second feedback paths conductive responsive to assertion of the enable input, and the current sense circuit configured to make the first and second feedback paths non-conductive responsive to de-assertion of the enable input.

17. The system of claim 16 wherein the operational amplifier further comprises:
a first stage defining a first stage voltage rail, a first stage ground, and a first stage output;
a second stage defining a second stage ground;
a controlled current source coupled between the first stage ground and the second stage ground; and
a diode coupled between the first stage voltage rail and the first stage ground;
the current sense circuit configured to electrically float the first stage ground with respect to the second stage ground by disabling the controlled current source, and further configured to force a voltage on the first stage voltage rail to be within a predetermined threshold voltage of the first stage ground.

18. The system of claim 16 wherein the current sense circuit further comprises:
a power-on reset (POR) circuit defining a sense input and a POR output, the sense input coupled to a source of power, the POR circuit configured to assert the POR output when voltage provided by the source of power exceeds a predetermined value;
an enable circuit defining the enable input, a power input, and an internal enable output, the power input coupled to the POR output, and the enable circuit configured to assert the internal enable output when both the enable input and power input are asserted;
a switch control circuit defining an enable input and a switch output, the enable input of the switch control circuit coupled to the internal enable output, and the switch output coupled to control inputs of the first and second feedback paths;
the switch control circuit configured to assert the switch output to make the first and second feedback paths conductive, and configured to de-assert the switch output to make the first and second feedback paths non-conductive responsive to de-assertion of the internal enable output.

19. The system of claim 18 wherein the first feedback path comprises a first electrically controlled switch.

20. The system of claim 18 wherein the second feedback path comprises a second electrically controlled switch, the second electrically controlled switch distinct from the first electrically controlled switch.

* * * * *